United States Patent [19]

Starner et al.

[11] 4,144,572
[45] Mar. 13, 1979

[54] ACCURATE PHASE-MEASURING SYSTEM USING ARITHMETIC SYNTHESIS

[75] Inventors: Eugene R. Starner, Bethlehem, Pa.; Edward J. Nossen, Cherry Hill, N.J.

[73] Assignee: RCA Corporation, New York, N.Y.

[21] Appl. No.: 824,964

[22] Filed: Aug. 15, 1977

[51] Int. Cl.² .................. G01R 25/00; G06J 1/00; H03B 3/04

[52] U.S. Cl. ................... 364/487; 324/83 D; 328/133; 328/155; 364/604

[58] Field of Search ........... 364/481, 487, 607, 608, 364/718, 604, 728, 819; 328/14, 133, 134, 155, 181, 185, 186; 307/227, 228, 232, 262; 324/78 D, 82, 83 D, 83 A, 83 FE

[56] References Cited

U.S. PATENT DOCUMENTS

| | | | |
|---|---|---|---|
| 3,663,956 | 5/1972 | Purdy et al. | 324/83 D |
| 3,895,294 | 7/1975 | Vinding | 324/83 D |
| 3,898,579 | 8/1975 | Aldridge | 328/14 X |
| 3,913,028 | 10/1975 | Bosselaers | 328/14 X |
| 3,973,209 | 8/1976 | Nossen et al. | 328/14 |
| 3,982,190 | 9/1976 | Schaefer | 328/155 X |

*Primary Examiner*—Joseph F. Ruggiero
*Attorney, Agent, or Firm*—H. Christoffersen; Samuel Cohen; George J. Seligsohn

[57] ABSTRACT

Circuit for comparing the difference in phase between two signals having like waveforms and adjusting the phase of one until the difference is zero. Two waveform generators, controlled by signals derived from the same clock source, produce the signals to be measured. One control signal is derived from the clock source by a fixed divider; the other, using an arithmetic synthesizer. The phase of the other control signal is adjusted by changing the frequency number of the arithmetic synthesizer and the phase difference is available as a binary number of n bits, where n is an integer. Precision of phase measurement in femtoseconds is possible.

7 Claims, 6 Drawing Figures

ACCURATE PHASE-MEASURING SYSTEM USING ARITHMETIC SYNTHESIS

This invention relates to the measurement of phase, specifically between two signals, by changing the phase of one signal until the phase difference with relation to a signal to be measured is zero.

Phase measurement is used in navigation, communication, radar, testing, and many other fields. The difference in phase between two signals is of interest in many of these applications. For example, in radio ranging, a signal having a given waveform is transmitted from one location, e.g., an airplane, and received by a transponder at another location, e.g., a ground station. The transponder locks onto the signal and re-transmits the same waveform substantially in phase with the received signal. (Any phase difference introduced by the transponder system is assumed to be a known constant.) The re-transmitted signal is received by the first location where the phase difference between the original transmitted signal and the received re-transmitted signal is measured. The phase difference is proportional to the range between the two locations, and the range can be measured only as precisely as the phase can be measured.

In a system embodying the invention, there is a circuit for controlling the phase of a signal, having means for generating the signal in response to a control signal and clock source means, includes the improvement comprising an arithmetic synthesizer with a frequency register for storing a frequency number and an accumulator for accumulating the frequency number into a phase number, for producing signals representative of phase coupled to the means for generating the signal as the control signal.

Figure 1:
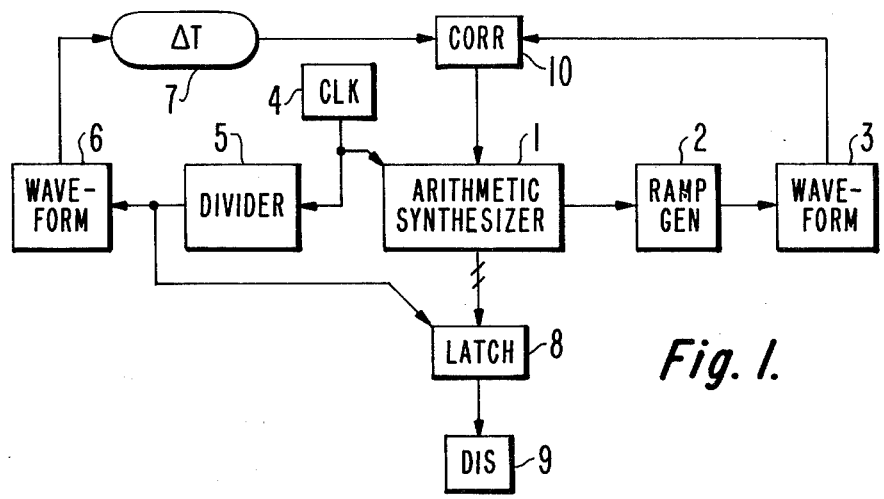
FIG. 1 is a logic block diagram of a system embodying the invention.

The circuit shown in FIG. 1 delays or advances the phase of one waveform until it is exactly in phase with another similar waveform to be measured. When the waveforms are exactly in phase, the phase difference can be measured to a value of $2^{-n}$ where n can be any reasonably sized integer. Therefore, the precision of the phase measurement can be made to any desired increment. The details of the circuits are described below.

An arithmetic synthesizer 1, which is well-known in the art, includes a binary frequency register, a binary adder, and a binary phase register. In response to a clock signal from a clock source 4, which can be a crystal-controlled astable multivibrator, the binary number in the frequency register (frequency number) is added to the binary phase number in the phase register and the result replaces the phase number in the phase register. If $T_o$ represents the period of the clock signal from the clock source 4; $N_p$, the maximum value that can be stored in the phase register ($=2^n-1$); and $N_f$, the value in the frequency register (frequency number), then the period $T_s$, of the signal generated by the arithmetic synthesizer 1 is given by $$T_s = T_o N_p / N_f \tag{1}$$

Two output signals from the arithmetic synthesizer can be used. One output signal is the binary signal from the phase register and is coupled to a latch 8 of n bits. The other output signal is an analog stairstep signal, obtained by coupling the binary phase signals to a digital-to-analog converter (DAC), which in turn is coupled to a ramp generator 2.

The ramp generator 2 supplies an output pulse for every period of the synthesized signal, i.e., every $T_s$ seconds. The phase of the output signal from the arithmetic synthesizer 1 is subject to noise, viz., time jitter. The ramp generator 2 removes the noise as described in a copending application "Arithmetic Synthesizer Frequency Generator with Reduced Phase Jitter," Ser. No. 818,715, filed July 25, 1977 by the same inventors and assigned to the same assignee as the present case.

Two waveform generators 3 and 6, in response to an input pulse, produce signals having substantially the same waveform. A simple waveform generator can be constructed of a counter which produces square wave signals. Sawtooth or pseudo-random signals can also be used.

A divider 5 divides down the frequency of the clock signal from the clock source 4. The value of the divider ratio is a constant approximately equal to $N_p/N_f$. The output signal from the divider 5 activates the waveform generator 6 and the latch 8. A display 9 or other utilization device is coupled to the latch output signals which represent a binary number (phase number) representative of the phase difference between the signals.

The phase difference is introduced by a delaying means 7 and it may be considered that the amount $\Delta T$ by which this device delays the signal initially is unknown. The measurement of the phase difference is actually a measurement of the propagation delay $\Delta T$ through the delaying means 7. The delaying means 7 can represent the medium through which a signal is transmitted and the delay introduced will in this case be proportional to the length of the signal path through this medium. The medium may be air or it may be a coaxial (or other type) cable through which a signal is transmitted for test or other purposes. The delaying means 7 represents in the most general way any means by which the phase of the output signal from the waveform generator 6 is delayed relative to the phase of the output signal from the waveform generator 3.

The output signal from the waveform generator 3 and the delayed output signal from the waveform generator 6 are compared by a correlator 10. The actual structure of the correlator 10 depends on the waveform being used as is explained below in more detail. The output signal from the correlator 10 increases or decreases the frequency number in the arithmetic synthesizer 1 depending on the phase difference between the input signals of the correlator. This produces a change in the control signal from the arithmetic synthesizer 1 to the waveform generator 3 that shifts the latter's phase in relation to the delayed signal from the waveform generator 6. As a result, when the phase difference has been zeroed, the value in the phase register of the arithmetic synthesizer 1 at the time of an output pulse from the divider 5 is related to the shift in phase of the signal from the waveform generator 3 necessary to zero the output signal from the correlator 10. If $N_a$ is the value in the phase register of the arithmetic synthesizer 1, the phase delay $\Delta T$ is given by:

$$\Delta T = T_o(N_p - N_a)/N_f \qquad (2)$$

The value stored in the latch 8, therefore, represents the phase delay to be measured. Although other utilization devices, e.g., a computer, may be used, a direct reading display 9 might also be provided. Proper choice of the parameters can make the display read-out represent an arbitrary value without computation devices. For example, if $N_p = 10,000$, $N_f = 1,000$, and $T_o = 1$ microsecond, $\Delta T = (10,000 - N_a)$ nanoseconds. The value $(10,000 - N_a)$ is, however, merely the binary complement of the value in the sum register. Therefore, if the complements of the binary signals from the arithmetic synthesizer 10 are stored in the latch 8, then the phase shift in nanoseconds can be read directly on the display.

In the circuit of FIG. 1 it is understood that the ramp generator 2 can be eliminated and the waveform generator 3 can be driven by the overflow signal from the adder in the arithmetic synthesizer 1. The precision of the phase measurements, however, will be degraded by the time jitter in the overflow signal which can be a maximum of $\pm\frac{1}{2}$ clock period. The overflow signal is actually a carry-out signal from the most significant stage of the adder in the arithmetic synthesizer 1 resulting from a sum value exceeding the adder's capacity.

Figure 2:
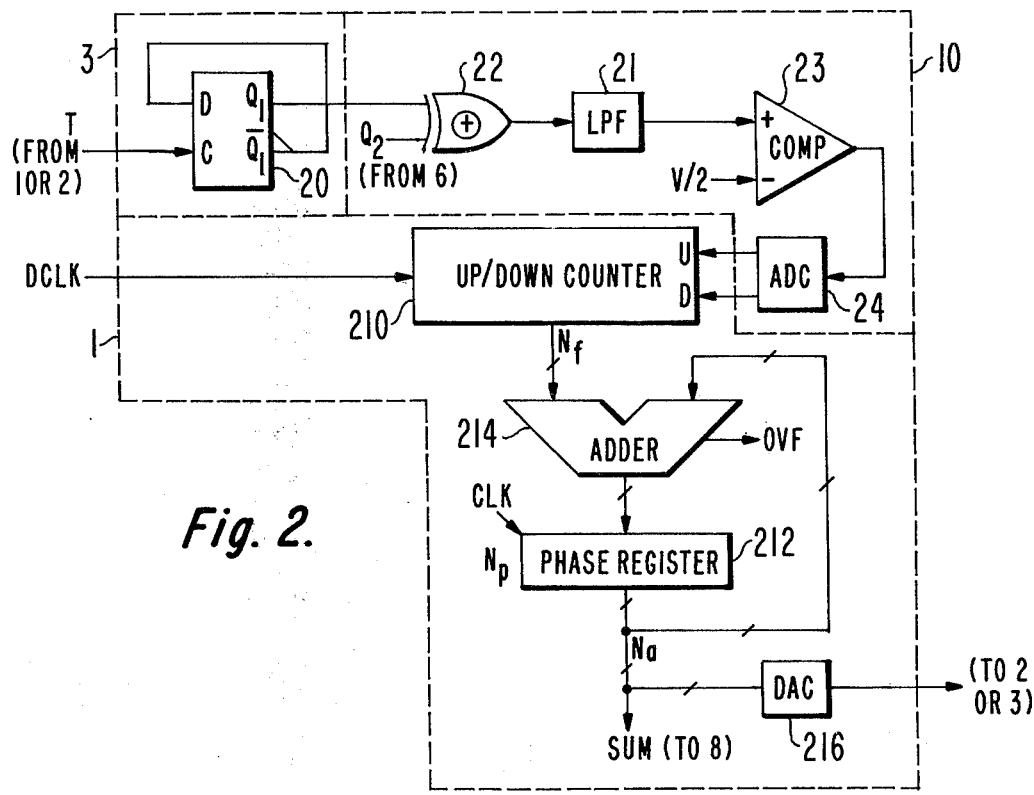
FIG. 2 is a logic block diagram illustrating a waveform generator and a suitable correlator therefor.

The circuit of FIG. 2 represents an example of a waveform generator and correlator as well as the details of a typical arithmetic synthesizer. The waveform generator can be implemented as a divide-by-two flip-flop 20 which produces square wave output signals.

The correlator for square wave signals can be constructed from an exclusive OR (XOR) gate 22 coupled to a comparator 23. The output signal from the XOR gate 22 can be filtered by a low pass filter 21 to reduce spurious signals to the noninverting input terminal of the comparator 23. The second input signal (Q2) to the XOR gate 22 is the delayed output signal from the second waveform generator (6, FIG. 1) via the delay. The inverting input to the comparator 23 is a reference voltage level, for example, half the voltage from a logical zero to a logical one in the particular system used. This type of correlator will produce a zero output signal when the input signals have a phase difference of 90° ($\frac{1}{4}$ cycle).

The output signal from the comparator 23 will be a signal having a value of $+V$ or $-V$ (where V is the supply voltage, both positive and negative, to the comparator) depending on the phase difference between the signals Q1 and Q2 from the first and second waveform generators, respectively. A signed analog-to-digital converter (ADC) 24 produces two output signals, the first signal having a value of logical one when the comparator output is $+V$ and a value of logical zero otherwise. The second signal has a value of logical one when the output signal from the comparator 23 has a value of $-V$, and a value of logical zero otherwise. Such ADC's are well-known in the art.

An arithmetic synthesizer suitable for use in the circuit has a frequency register 210 which can be implemented from a standard up/down counter, a phase register 212 which can be an n-bit latch, and an adder 214 which has as its input operands the contents of the up-/down counter 210 and the phase register 212. In response to a clock signal, the sum of the two registers' values replace the value previously stored in the phase register 212. A derived clock signal increments or decrements the value in the up/down counter (frequency register) 210 depending on whether the up count control signal (U) or down count control signal (D) has a value of logical one. If neither signal has a value of logical one, the contents of the counter 210 are not changed by the derived clock signal. The derived clock signal can be taken from the divider 5 in FIG. 1. The output signals from the phase register 212 are applied to a digital-to-analog converter 216 to produce a stairstep output signal to the ramp generator 2 in FIG. 1.

Figure 3:
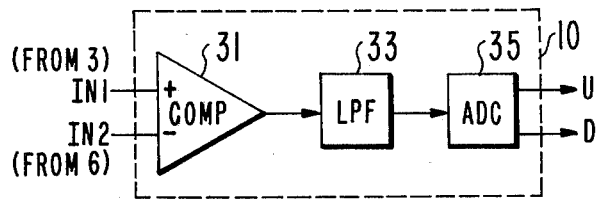
FIG. 3 is a logic block diagram of a suitable correlator for sawtooth waveform signals.

The waveform generators as noted above can generate any of several wave shapes. For a sawtooth waveshape, a correlator such as illustrated in FIG. 3 can be used. A comparator 31, which can be an open circuit operational amplifier, receives as its two input signals the waveform from the generator 3 (FIG. 1) and the delayed waveform from the waveform generator 6. The output signal from the comparator will be $+V$ or $-V$, depending on the relative values of the input signals. Any small variations or transients in the output signal from the comparator 31 are smoothed in a low pass filter 33 and the signal converted by an analog-to-digital converter 35 into the control signals.

Figure 5:
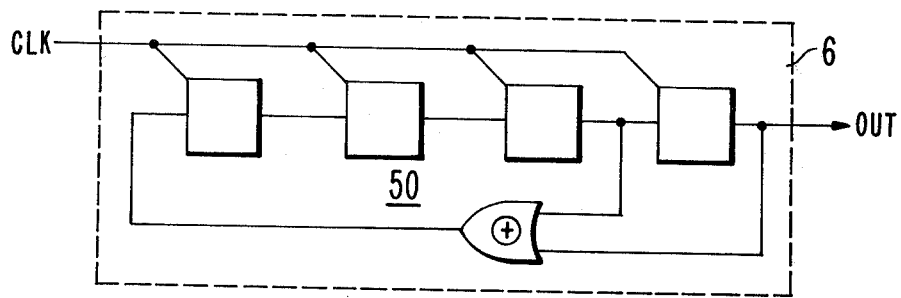
FIG. 5 is a logic diagram of a typical pseudo-random code generator.

A waveform generator of the pseudo-random code generator (PRG) type is illustrated in FIG. 5. A shift register 50 of four stages is feedback-coupled to produce a serial input value of logical one when the values stored in the two final stages are different and of logical zero otherwise. At least one stage must be set initially; in the circuit of FIG. 5, it is the final stages. The output sequence generated at the final stage is 100010011010111. In general, an n-stage PRG produces a non-cyclic sequence of $2^n - 1$ bits. The n stages cycle through all $2^n$ combinations except that of all zeroes. The sequence depends on the feedback connections. The last stage must always provide one of the feedback connections, else it would be equivalent to an $(n-1)$ stage generator. All possible feedback connections do not produce the maximum cycle length of $2^n - 1$ bits. For example, if the feedback connection were taken from the second stage versus the third in the circuit of FIG. 1, the longest non-cyclic sequence would be 100010. If the first stage were used instead of the third, however, another maximum sequence is generated, viz., 100011110101100. Tables showing feedback connections for PRG's with up to 100 stages are available in the literature.

Figure 4:
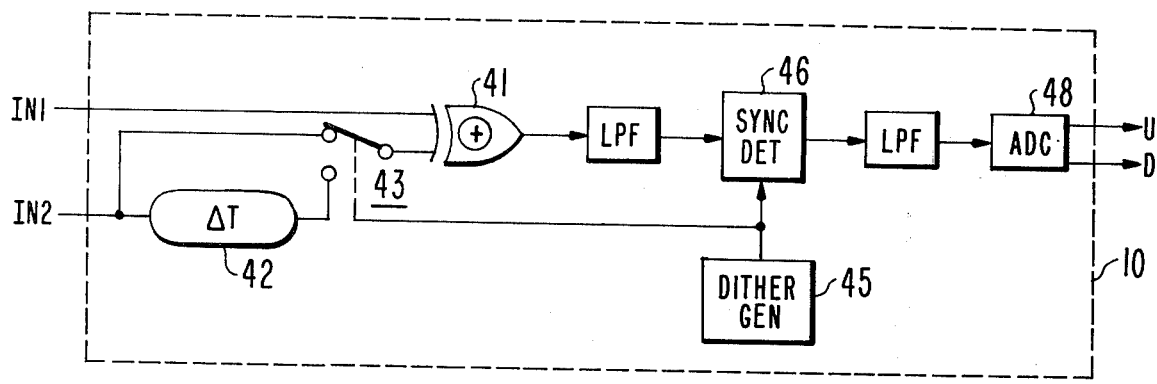
FIG. 4 is a logic block diagram of a suitable correlator for pseudo-random signals.

A correlator for pseudo-random signals is shown in FIG. 4. One input signal (IN 1) is coupled directly to an XOR gate 41 and the other (IN 2), through a delay 42 to a switch 43. The delay 42 is not related to the delay 7; the amount of delay in the delay device 42 is selected by design. Half the delay value must be subtracted from the phase measurement. The second input (IN 2) is also coupled directly to the switch 43, which can be a solid state switching device of standard form. A dither generator 45 supplies oscillatory output signals which operate the switch 43 and a synchronous detector 46. The input signal to the synchronous detector 46 is the filtered output signal from the XOR gate 41. The output signal from the synchronous detector 46 is filtered and applied to an analog-to-digital converter 48 to supply the control signals.

Figure 6:
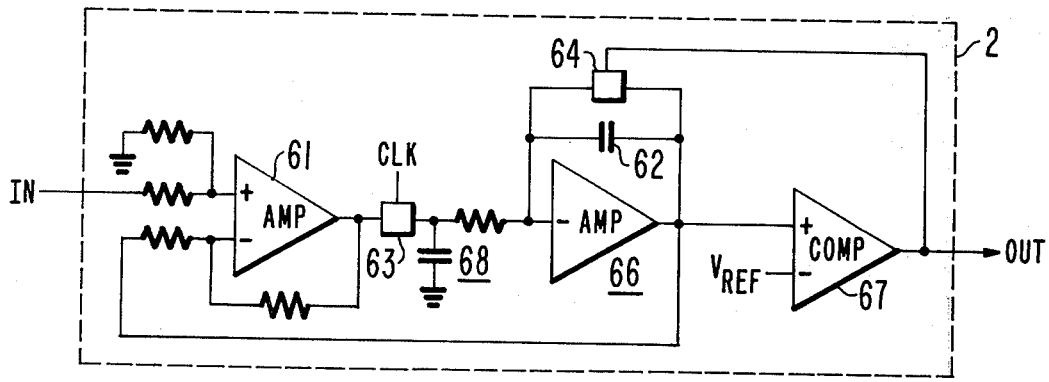
FIG. 6 is a schematic of a suitable ramp generator circuit.

A suitable ramp generator circuit is shown in FIG. 6. The input signal (IN) is the output signal from the DAC 216 (FIG. 2). The value of the input signal is compared to the value of the ramp signal by an amplifier-comparator 61. The difference voltage from the amplifier 61 is transferred to a holding capacitor 68 by a transmission gate 63 in response to a clock signal from the clock source 4 (FIG. 1). The potential charge on the capacitor 68 controls the slope of the output signal from an integrator 66 including a feedback capacitor 62. When the ramp signal from the integrator 66 exceeds some reference voltage ($V_{REF}$), a comparator 67 produces a positive transition output signal (OUT) which controls the associated waveform generator and also activates a transmission gate 64 to discharge the feedback capacitor 64.

In the circuit of FIG. 1, for which all the components have been described in detail, it will be assumed that the frequency of the waveform generator output signals is about 100 kHz and that n — the number of bits in the phase register, adder, and so on — is 32. Also, let the clock frequency be 1 MHz and the ratio of the divider 5 be 1/10. The initial frequency number should be approximately $429.5 \times 10^6$. (Since $N_p = 2^n - 1$, for $n=32$, $N_p = 429.5 \times 10^7$.) Therefore, the arithmetic synthesizer will overflow, on the average, every 10 microseconds corresponding to a frequency of approximately 100 kHz. By changing the least significant bit of the frequency number, a change of phase in the control signal to the waveform generator 3 equal to $2^{-32} 33\ 10^{-6}$ (clock period) sec. or approximately 0.233 femtoseconds is possible using the ramp generator which removes the limitation of $\pm \frac{1}{2}$ clock period.

What is claimed is:

1. A circuit for measuring the phase difference between two signals comprising, in combination:
   clock source means for supplying first clock signals;
   arithmetic synthesizer means, responsive to said first clock signals, including frequency register means, adder means, and phase register means for producing binary output phase signals and overflow signals;
   means responsive to said first clock signals for producing second clock signals having a fixed relation to said first clock signals;
   first and second waveform generator means responsive to said overflow signals and said second clock signals, respectively, for producing signals having a given waveshape;
   correlator means responsive to the signal from said first waveform generator means and to a delayed signal from said second waveform generator means for producing a phase signal representing the phase difference between the signal from said first waveform generator means and said delayed signal from said second waveform generator means; and
   means for coupling said phase signal to the frequency register means and including means for modifying the contents of said frequency register to vary the phase of said overflow signal in a direction to produce a zero phase difference.

2. The invention as claimed in claim 1 wherein said means for producing second clock signals includes binary divider means.

3. The invention as claimed in claim 1 wherein said frequency register includes up/down counter means having control input means for determining the count direction.

4. The invention as claimed in claim 3 wherein said correlator means includes:
   comparator means responsive to the signal from said first waveform generator means and to a delayed signal from said second waveform generator means for producing first and second signals, representative of the direction of the phase difference between the signal from said first waveform generator means and the delayed signal from said second waveform generator means; and
   means for coupling said first and second signals from said comparator means to said control input means of said up/down counter means.

5. The invention as claimed in claim 4 including ramp generating means responsive to said binary output sum signals for producing the overflow signals.

6. In a circuit for controlling the phase of a signal including means for generating said signal in response to a control signal and clock source means for deriving clock signals having a given clock period, the improvement comprising;
   arithmetic synthesizer means responsive to said clock signals from said clock source means, including frequency register means for storing a frequency number and accumulator means for accumulating said frequency number into a phase number having a new value at the end of each clock period derived solely by adding said frequency number at the end of each clock period to the value of the phase number then already stored in said accumulator means, for producing signals representative of phase; and
   means for coupling said signal representative of phase to said means for generating as said control signal.

7. The invention as claimed in claim 6 wherein said means for coupling includes ramp generator means for producing continuous phase signals.

* * * * *